(12) United States Patent
Tsuji et al.

(10) Patent No.: US 6,464,444 B1
(45) Date of Patent: Oct. 15, 2002

(54) APPARATUS FOR PEELING OFF CHIPS USING A PLURALITY OF FIRST AND SECOND PROTRUSIONS

(75) Inventors: Hiroyuki Tsuji, Nagoya; Takao Ohnishi, Nishikasugai-Gun, both of (JP)

(73) Assignee: NGK Insulators, Ltd. (JP)

( * ) Notice: Subject to any disclaimer, the term of this patent is extended or adjusted under 35 U.S.C. 154(b) by 0 days.

(21) Appl. No.: 09/604,801

(22) Filed: Jun. 28, 2000

Related U.S. Application Data (62) Division of application No. 08/825,111, filed on Mar. 27, 1997, now Pat. No. 6,106,222.

(30) Foreign Application Priority Data

Mar. 29, 1996 (JP) ................................................ 8-77407

(51) Int. Cl.[7] .................................................. B26F 3/00
(52) U.S. Cl. .................. 414/411; 414/416.01; 414/403; 29/413; 438/460; 225/2
(58) Field of Search ................................ 414/811, 403, 414/411, 416.01, 800, 781; 29/413; 225/96.5, 2, 103; 53/435; 257/798; 438/113, 460, 464; 156/584

(56) References Cited

U.S. PATENT DOCUMENTS

| | | | |
|---|---|---|---|
| 3,707,760 A | 1/1973 | Citrin | |
| 3,747,282 A * | 7/1973 | Katzke | 156/584 X |
| 3,790,051 A | 2/1974 | Moore | |
| 3,988,196 A * | 10/1976 | Wanesky | 156/584 X |
| 4,556,362 A | 12/1985 | Bahnck | |
| 4,744,550 A | 5/1988 | Oglesbee | |
| 4,778,326 A * | 10/1988 | Althouse et al. | 156/584 X |
| 4,921,564 A * | 5/1990 | Moore | 156/584 X |
| 5,310,104 A | 5/1994 | Zaidel et al. | |
| 5,351,872 A | 10/1994 | Kobayashi | |

FOREIGN PATENT DOCUMENTS

| | | | |
|---|---|---|---|
| EP | 0431637 | 6/1991 | |
| JP | 62-166536 | * 7/1987 | 156/584 |

* cited by examiner

Primary Examiner—Frank E. Werner
(74) Attorney, Agent, or Firm—Parkhurst & Wendel, LLP (57) ABSTRACT

A chip peeling apparatus has a plurality of protrusions which include first protrusions and second protrusions lower than the first protrusions. A vacuum pump communicates through holes with grooves defined between adjacent ones of the protrusions. A UV sheet is attached to chips, and the chips are supported in the vicinity of their corners by the tops of the first protrusions. When the vacuum pump is actuated, the chips and streets disposed between the chips are lowered, and the chips are curved and supported in abutment against the tops of the second protrusions. Each of the chips is gradually peeled off the UV sheet under a force tending to recover the original shape of the curved sheet. The chip peeling apparatus is effective in preventing the chips from being damaged and positionally deviated when the chips are attracted and carried.

11 Claims, 10 Drawing Sheets

APPARATUS FOR PEELING OFF CHIPS USING A PLURALITY OF FIRST AND SECOND PROTRUSIONS

This is a Division of application Ser. No. 08/825,111 filed Mar. 27, 1997, now U.S. Pat. No. 6,106,222.

BACKGROUND OF THE INVENTION

1. Field of the Invention

The present invention relates to a method of and an apparatus for peeling chips fabricated on a wafer of silicon or the like off a sheet attached to the reverse side of the wafer in a process of manufacturing ICs or the like.

2. Description of the Related Art

Figure 10:
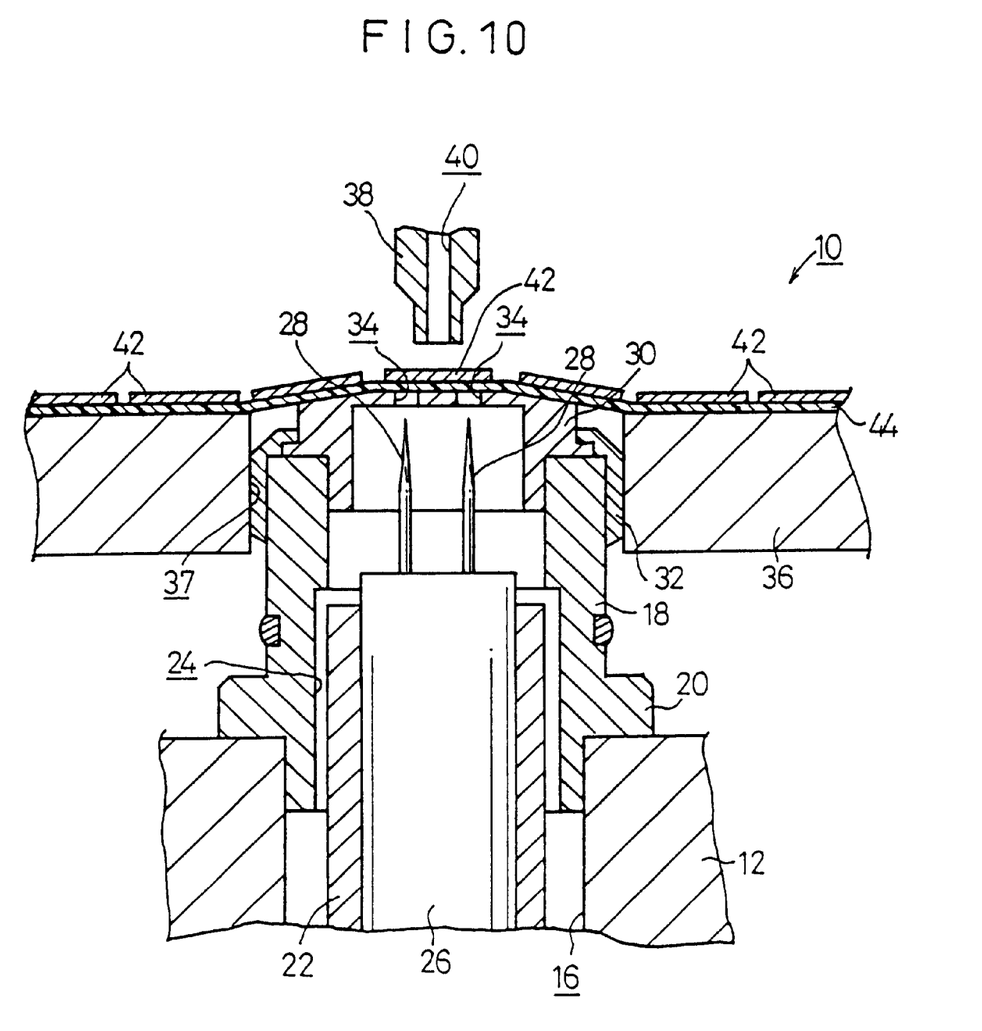
FIG. 10 is an enlarged vertical cross-sectional view of a conventional chip peeling apparatus.

FIG. 10 of the accompanying drawings shows a conventional chip peeling apparatus 10. As shown in FIG. 10, the conventional chip peeling apparatus 10 includes a base 12 having a hole 16 defined therein which is connected to a first vacuum source (not shown). A tubular member 18 has an end fitted in an upper open end of the hole 16 and a flange 20 projecting radially outwardly from an outer circumferential surface thereof. The flange 20 is fixedly mounted on the end of the base 12 which defines the upper open end of the hole 16, thereby supporting the tubular member 18 on the base 12. A cylindrical member 22 is inserted in the hole 16 and has an outer wall surface and a distal end spaced from an inner wall surface of the tubular member 18 which defines a hole 24 therein. A pin 26 is inserted in the cylindrical member 22 for axial sliding movement in the cylindrical member 22, and supports a plurality of needles 28 mounted upwardly on a distal end of the pin 26. A suction nozzle 30 is fitted in a distal end of the tubular member 18 and fixed to the tubular member 18 by a cover 32. The suction nozzle 30 has a plurality of holes 34 defined therein for insertion of the needles 28.

A seat 36 is positioned in upwardly spaced relation to the base 12, and the suction nozzle 30 has a distal end projecting upwardly slightly from a hole 37 that is defined in the seat 36. A suction head 38 is disposed upwardly of the suction nozzle 30 for movement toward and away from the suction nozzle 30. The suction head 38 has an axial hole 40 defined therein which is connected to a section vacuum source (not shown).

A process of peeling chips 42 such as of ICs or the like fabricated on a wafer off a sheet 44 using the chip peeling apparatus 10 will be described below.

As shown in FIG. 10, when the sheet 44 to which the chips 42 are attached is moved to a position above the seat 36 and brought into held against an upper portion of the suction nozzle 30, the sheet 44 is curved upwardly. When the center of a desired one of the chips 42 is aligned with the center of the suction nozzle 30, the first vacuum source (not shown) is actuated to attract the sheet 44 to the suction nozzle 30.

Figure 11:
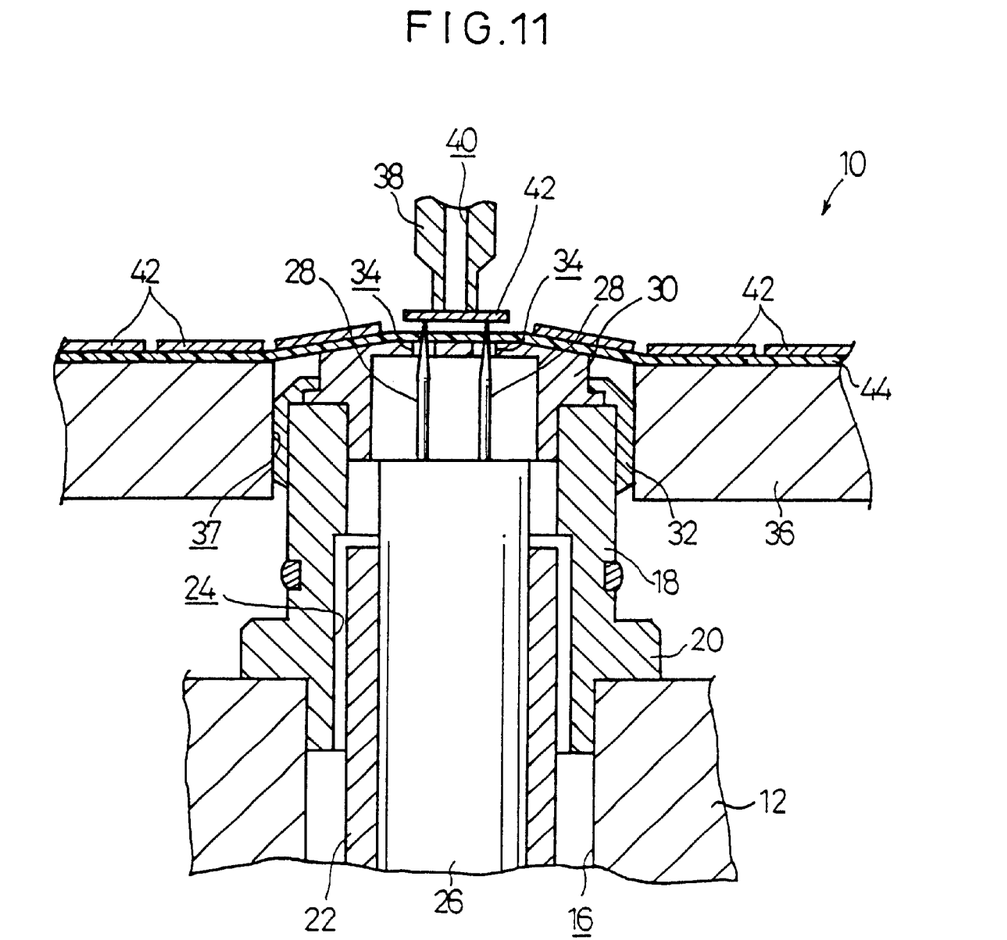
FIG. 11 is an enlarged vertical cross-sectional view showing the manner in which the conventional chip peeling apparatus illustrated in FIG. 10 operates.

Then, the pin 26 is lifted to cause the needles 28 to pierce and project through the sheet 44, and ascend with the chip 42 placed on the tips of the needles 28, as shown in FIG. 11 of the accompanying drawings. At this time, since the sheet 44 is attracted to the suction nozzle 30, the chip 42 is peeled off the sheet 44.

Thereafter, the suction head 38 is moved toward the suction nozzle 30 and brought into abutment against the chip 42. The second vacuum source (not shown) is actuated to attract the chip 42 off the sheet 44 to the suction head 38. The chip 42 will then be transferred to another location.

Figure 12:
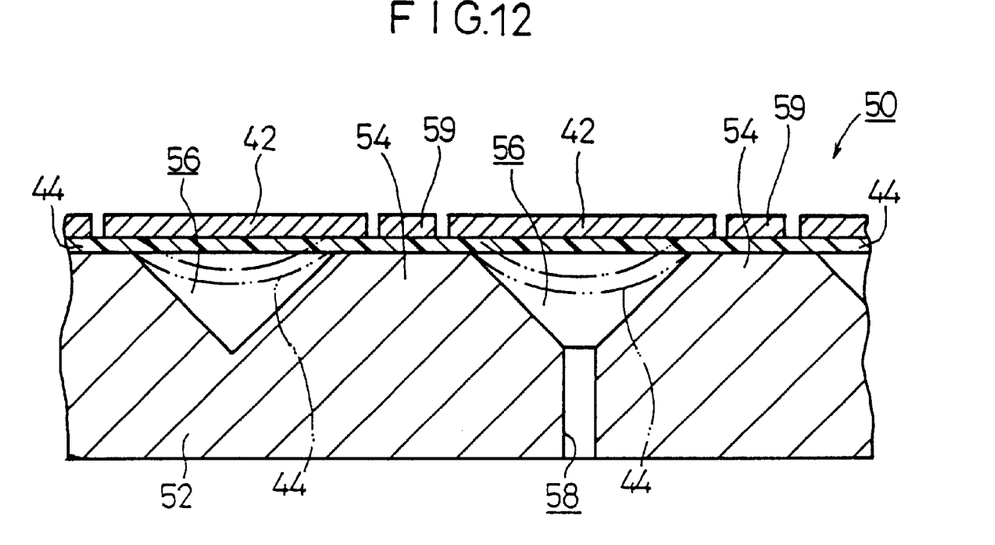
FIG. 12 is an enlarged vertical cross-sectional view of another conventional chip peeling apparatus.

FIG. 12 of the accompanying drawings shows another conventional chip peeling apparatus 50. As shown in FIG. 12, the conventional chip peeling apparatus 50 includes a peeling base 52 having a plurality of protrusions 54 with flat tops, the protrusions 54 having heaters (not shown). The peeling base 52 has grooves 56 each defined between adjacent ones of the protrusions 54 and communicating with a hole 58 defined in the peeling base 52 which is connected to a vacuum source (not shown). A suction head (not shown) is positioned above one of the grooves 56 for movement toward and away from the peeling base 52.

A sheet 44 with a plurality of chips 42 and streets 59 remaining as cut fragments in gaps between the chips 42 is moved toward a position above the peeling base 52 with the chips 42 above the grooves 56. The protrusions 54 have been heated by the heater to apply heat to the sheet 44, thereby making the sheet 44 stretchable. The vacuum source is actuated to evacuate the grooves 56, whereupon the sheet 44 is stretched and curved in the direction in which the vacuum is developed, as indicated by the two-dot-and-dash lines. At this time, the chips 42 have their peripheral edges supported on the flat tops of the protrusions 54, and the sheet 44 is peeled off central regions of the chips 42.

Then, the suction head (not shown) is moved toward a desired one of the chips 42. Because of an attracting action of the suction head, the sheet 44 is peeled off the peripheral edges of the chip 42, which is attracted to and held by the suction head. The chip 42 will then be transferred to another location.

The former chip peeling apparatus 10 is disadvantageous in that the tips of the needles 28 tend to damage the surface of the chip 42. When the needles 28 are elevated, the sheet 44 itself may also be stretched and lifted. At this time, the needles 28 may not pierce the sheet 44, and hence may not form holes in the sheet 44, with the result that the chip 44 may not be separated from the sheet 44.

The latter chip peeling apparatus 50 is also problematic in that when the sheet 44 is attracted, the chip 42 itself may be curved, and when the sheet 44 is peeled off, the chip 42 may jump off, resulting in a positional deviation which may prevent the suction head from attracting the chip 42. As a result, when the chip 42 is to be transferred to and placed in a further process, the chip 42 cannot be positioned with accuracy. When the chip 42 is curved, it cannot be prevented from being unduly curved to an unnecessary extent, and hence may be cracked or broken. If the chip 42 is broken, it is liable to damage the sheet 44, eliminating the vacuum thereby to fail to peel other normal chips 42 off the sheet 44. Furthermore, when a chip 42 is to be peeled off by the suction head, a street 59 which lies at the same height as the chip 42 may also be peeled off the sheet 44, and attracted and transferred together with the chip 42 by the suction head.

SUMMARY OF THE INVENTION

It is a general object of the present invention to provide a method of and an apparatus for peeling off chips, which have been attached to a sheet and fed therewith, easily and reliably off the sheet for transfer to another process.

A major object of the present invention is to provide a method of and an apparatus for peeling chips, which have been attached to a sheet and fed therewith, off the sheet without damage to the chips while allowing the chips to suffer undesirable positional deviations after the chips have been peeled off.

Another object of the present invention is to provide a method of and an apparatus for peeling chips, which have been attached to a sheet and fed therewith, off the sheet without damage to the sheet while allowing other chips to be peeled reliably off the sheet.

Still another object of the present invention is to provide a method of and an apparatus for peeling chips off a sheet without the possibility of peeling off streets attached to the sheet between the chips.

Yet still another object of the present invention is to provide a method of and an apparatus for peeling chips, which have been attached to a sheet and fed therewith, off the sheet efficiently within a short period of time.

The above and other objects, features and advantages of the present invention will become more apparent from the following description when taken in conjunction with the accompanying drawings in which a preferred embodiment of the present invention is shown by way of illustrative example.

DETAILED DESCRIPTION OF THE PREFERRED EMBODIMENT

Figure 1:
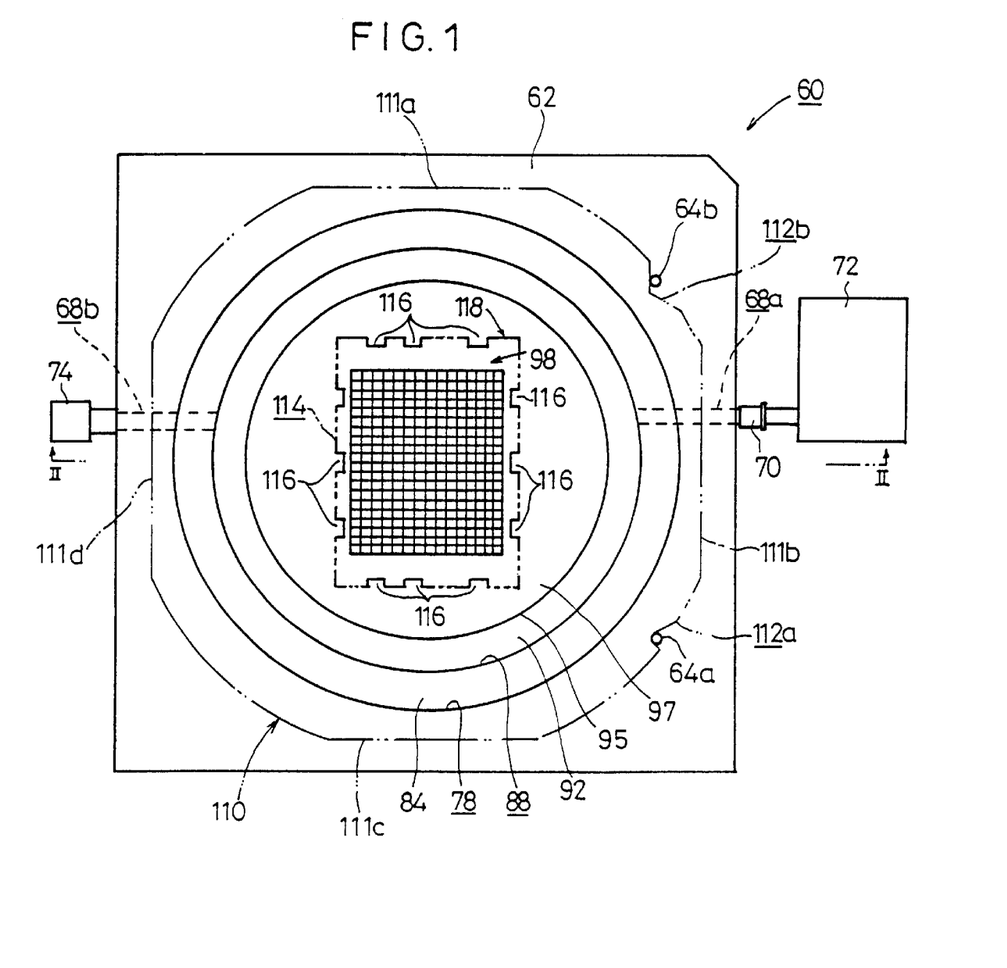
FIG. 1 is a plan view of a chip peeling apparatus according to an embodiment of the present invention.
Figure 2:
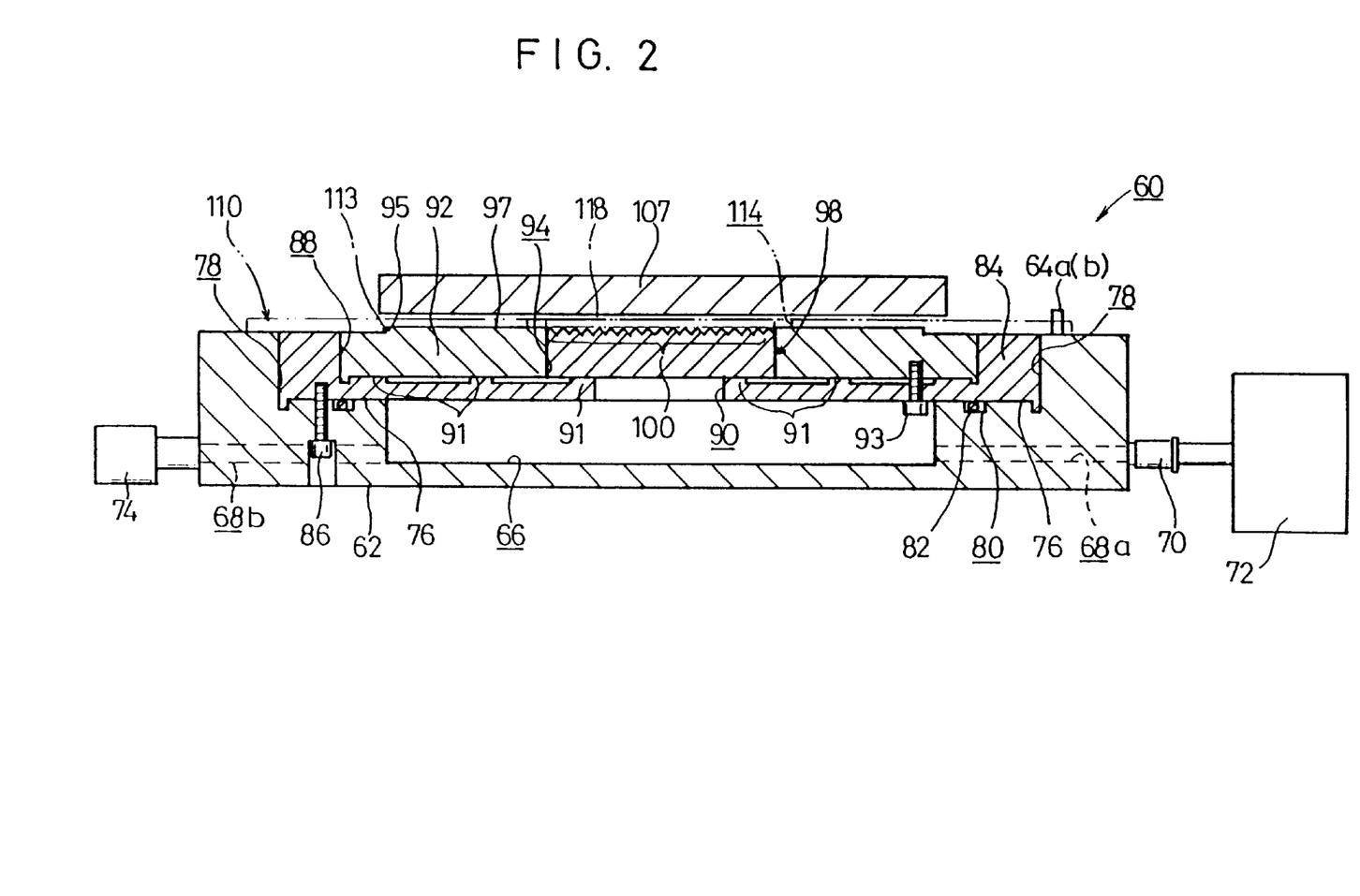
FIG. 2 is a cross-sectional view taken along line II—II of FIG. 1.

FIGS. 1 and 2 show a chip peeling apparatus 60 according to an embodiment of the present invention.

As shown in FIGS. 1 and 2, the chip peeling apparatus 60 includes a substantially square base 62 having a pair of pins 64a, 64b vertically mounted on an upper surface thereof. As shown in FIG. 2, the base 62 has a chamber 66 defined therein and a pair of horizontal passages 68a, 68b defined therein which are held in communication with the chamber 66. The passage 68a is connected through a coupling 70 to a vacuum pump 72, and the passage 68b is connected to a bushing 74, to which the coupling of another chip peeling apparatus can be connected. Therefore, a plurality of chip peeling apparatus 60 may be connected in series with each other and coupled to the single vacuum pump 72.

The base 62 also has a large-diameter upwardly open circular hole 78 defined therein which communicates with the chamber 66 with a horizontal step 76 extending therebetween. The step 76 has a circular groove 80 defined in its upper surface in surrounding relation to the chamber 66, with an annular o-ring 82 fitted in the groove 80. A circular seat 84 is fitted in the hole 78 and fastened to the base 62 by a screw 86. The seat 84 has an upwardly open circular recess 88 defined therein partly by a bottom which has a central hole 90 communicating with the chamber 66. The bottom which defines the circular recess 88 has a plurality of concentric annular ridges 91 disposed on its upper surface. A circular support base 92 is fitted in the recess 88 and supported on the annular ridges 91. The support base 92 is fastened to the seat 84 by a screw 93. The support base 92 also has a circular step 95 disposed on its upper surface and extending in the vicinity of an outer circumferential edge thereof, with a flat surface 97 lying radially inwardly of the step 95. The support base 92 further includes a substantially central hole 94 defined therein, with a peeling base 98 fitted in the hole 94.

Figure 3:
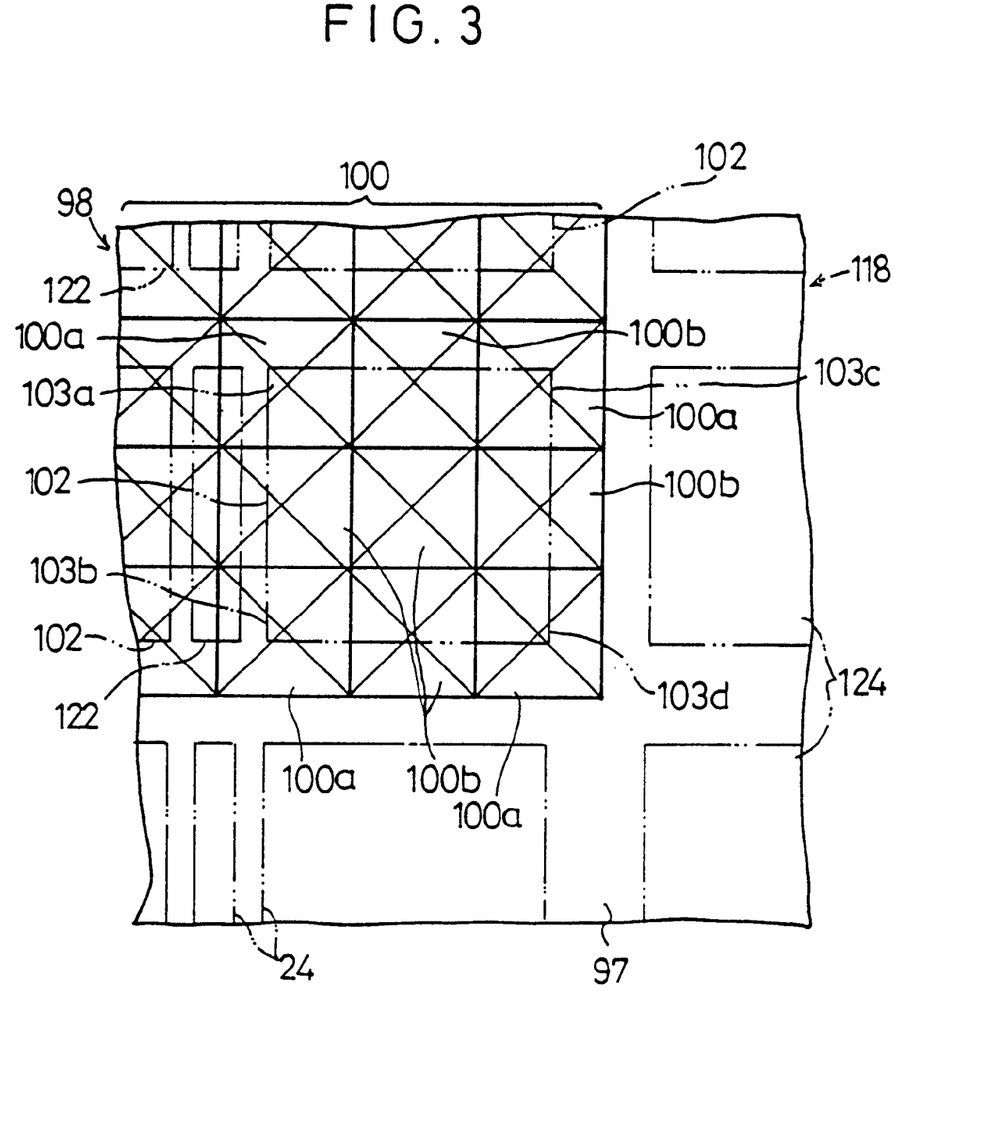
FIG. 3 is an enlarged fragmentary plan view of the chip peeling apparatus shown in FIG. 1.
Figure 4:
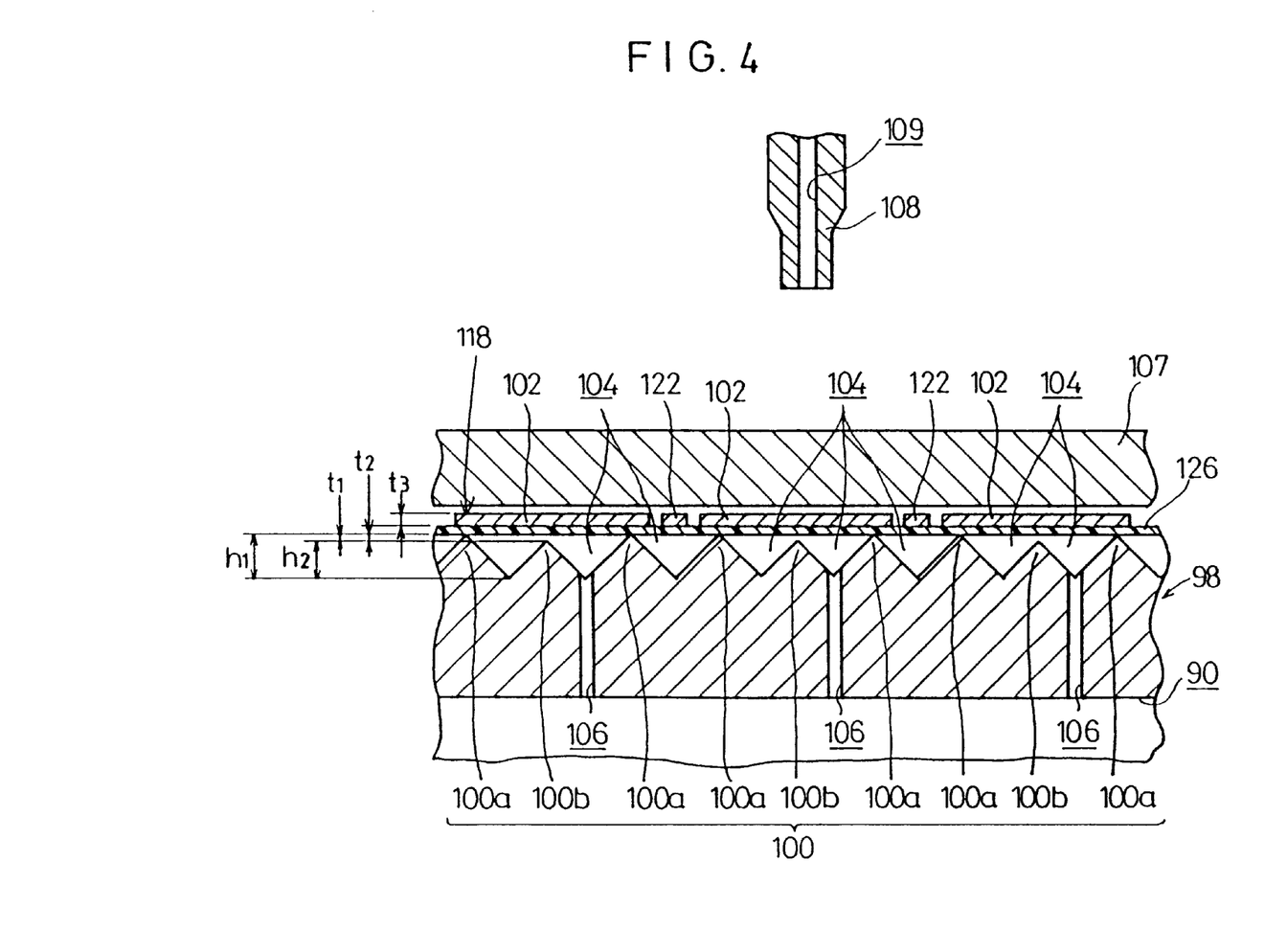
FIG. 4 is an enlarged vertical cross-sectional view of the chip peeling apparatus shown in FIG. 1.

The peeling base 98 will be described in detail below. As shown in FIGS. 3 and 4, the peeling base 98 has a plurality of closely positioned upward protrusions 100 each in the form of a quadrangular pyramid on its upper surface. The protrusions 100 include first protrusions 100a having a height $h_1$ and second protrusions 100b having a height $h_2$ which is smaller than the height $h_1$. The difference $t_1$ between the heights $h_1$, $h_2$ is equal to or smaller than a sheet thickness $t_2$ described later on. The first protrusions 100a are positioned so as to be aligned with respective corners 103a~103d of chips 102 (described later on), and the second protrusions 100b are positioned in other regions. For example, if chips 102 are of a substantially square or rectangular shape, then the first protrusions 100a are positioned so as to abut against the four corners 103a~103d of the chips 102.

As shown in FIG. 4, the peeling base 98 has a plurality of holes 106 defined vertically therein which communicate with grooves 104 that are defined between certain protrusions 100 and protrusions 100 adjacent thereto. The holes 106 communicate with the hole 90 defined in the seat 84. Therefore, the grooves 104 communicate with the vacuum pump 72 through the hole 90, the chamber 66, the passage 68a, and the coupling 70. Each of the holes 106 is positioned in the vicinity of the center of one of the chips 102.

A holder plate 107 and a suction head 108 are disposed above the peeling base 98 for movement toward and away from the peeling base 98 by an actuator (not shown). The holder plate 107 is made of an electrically conductive material, and can be moved to a position that is spaced from the chips 102 by a distance equal to or smaller than the thickness $t_3$ of the chips 102. The suction head 108 has an axial hole 109 defined therein which communicates with a vacuum source (not shown).

A wafer retainer plate 110 for being mounted on the chip peeling apparatus 60 will be described below.

As indicated by the two-dot-and-dash lines in FIGS. 1 and 2, the wafer retainer plate 110 is of a substantially circular shape and has a plurality of linear edges 111a, 111b, 111c, 111d in respective 90°-spaced positions. The wafer retainer plate 110 has recesses 112a, 112b defined in outer circumferential edges thereof one on each side of the linear edge 111b. When wall surfaces which define the recesses 112, 112b engage the pins 64a, 64b of the chip peeling apparatus 60, the wafer retainer plate 110 is positioned with respect to the chip peeling apparatus 60. The wafer retainer plate 110 has a step 113 defined in a lower surface thereof for engagement with the step 95 of the support base 92. The wafer retainer plate 110 has a substantially rectangular hole 114 defined centrally therein by walls having a plurality of inwardly projecting teeth 116.

Figure 5:
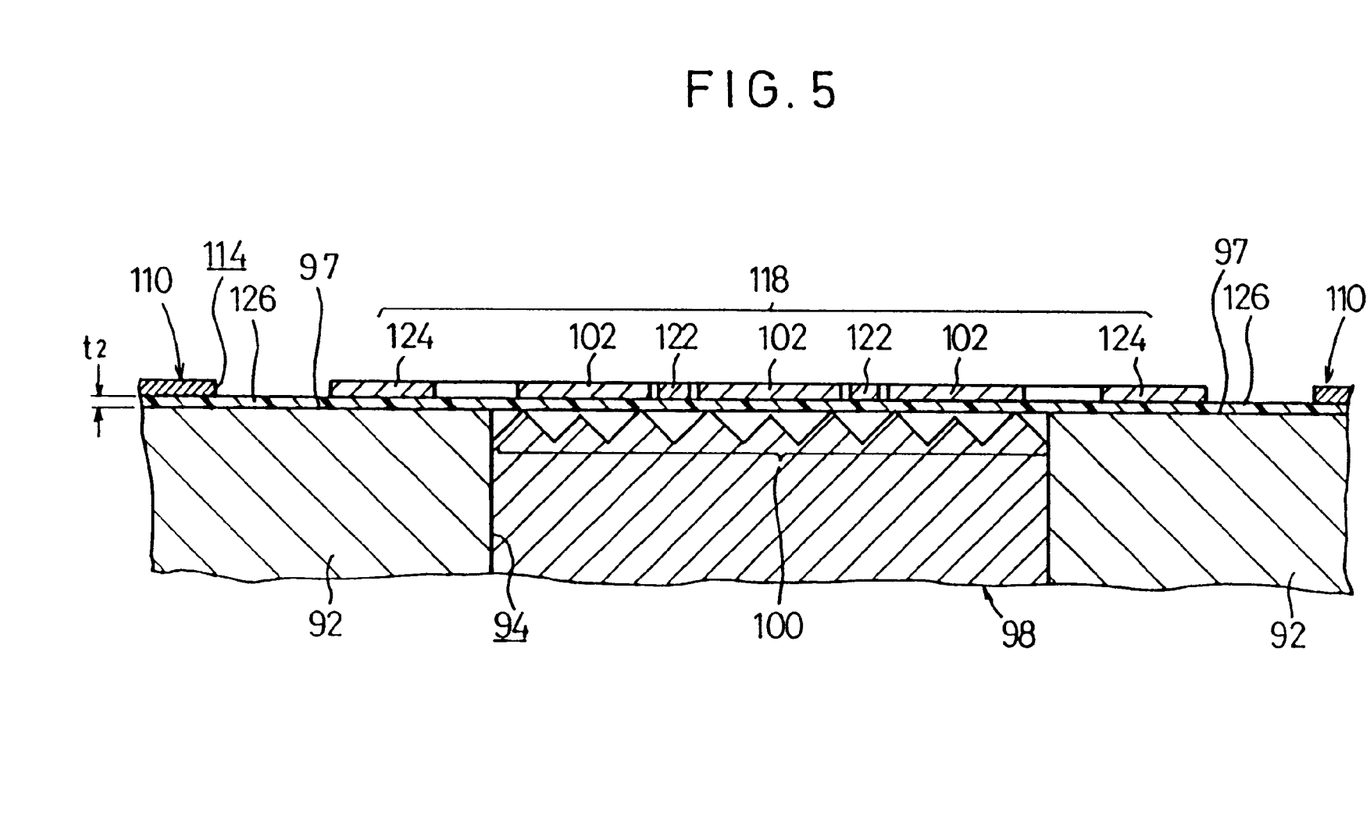
FIG. 5 is an enlarged vertical cross-sectional view of the chip peeling apparatus shown in FIG. 1 and a wafer placed thereon.

As shown in FIG. 5, an ultraviolet radiation absorbing, flexible sheet (hereinafter referred to as a "UV sheet") 126 having a thickness $t_2$ is attached to the lower surface of the wafer retainer plate 110. A substantially square wafer 118 of silicon or the like is disposed in the hole 114 and held against an upper surface of the UV sheet 126.

As shown in FIGS. 3 through 5, the wafer 118 has a plurality of square chips 102 and a plurality of elongate rectangular streets 122 remaining as cut fragments in gaps between the chips 102. The wafer 118 also has a tab 124 on its outer peripheral edges in surrounding relation to the chips 102. The streets 122 and the tab 124 are unwanted parts that are produced in a process of fabricating the chips 102, and will be discarded after the chips 102 are fabricated.

Operation of the chip peeling apparatus 60 in relation to a chip peeling method will be described below.

As shown in FIGS. 1 and 2, the wafer retainer plate 110 which is holding the wafer 118 is placed on the chip peeling apparatus 60. The wafer 118 is positioned with respect to the chip peeling apparatus 60 by bringing the walls of the recesses 112a, 112b into engagement with the pins 64a, 64b. At this time, as shown in FIG. 3, the first protrusions 100a have their tops held in abutment against the UV sheet 126 on the reverse side of the chips 102 in the vicinity of the four corners 103a~103d of the chips 102, thus supporting the chips 102. As shown in FIG. 4, the tops of the second protrusions 100b are spaced from the UV sheet 126 by the distance $t_1$ which is equal to or smaller than the thickness $t_2$ of the UV sheet 126. The streets 122 are positioned between first protrusions 100a and first protrusions 100a adjacent thereto, and are not supported by the first protrusions 100a or the second protrusions 110b. As shown in FIGS. 3 and 5, the tab 124 is positioned over the flat surface 97, and in intimate contact therewith through the UV sheet 126.

Figure 6:
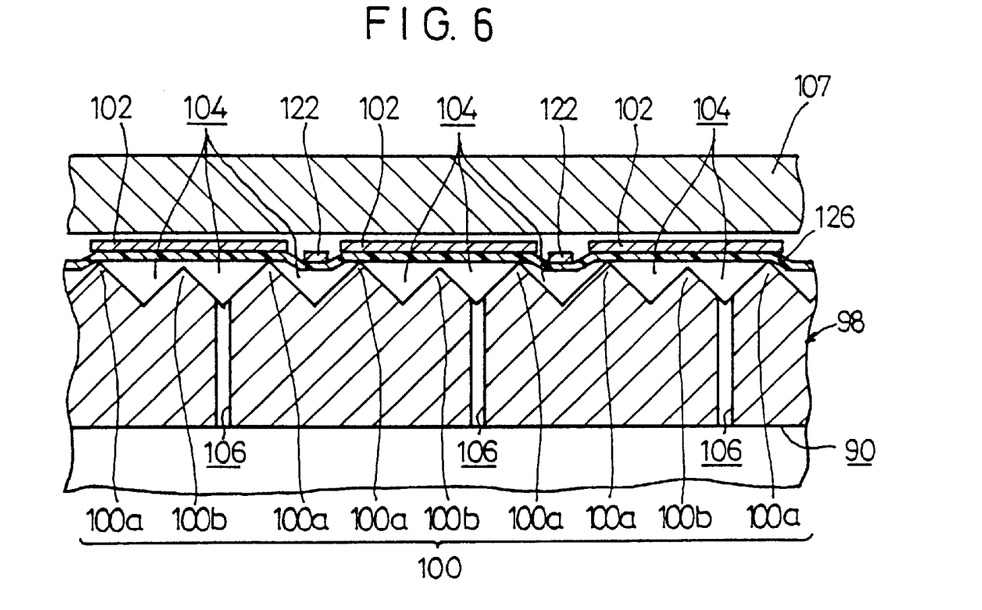
FIG. 6 is an enlarged vertical cross-sectional view showing the manner in which the chip peeling apparatus shown in FIG. 1 operates, with portions of a sheet and streets being lowered.

When the vacuum pump 72 is actuated, air in the grooves 104 is discharged through the holes 106, the hole 90, and the passage 68a, lowering the air pressure in the grooves 104. As shown in FIG. 6, the UV sheet 126 is stretched into the grooves 104 under a vacuum, lowering the streets 122 which are not supported by the protrusions 100. The UV sheet 126 is now peeled off the edges of the chips 102. Since the streets 122 descend with the UV sheet 126 at this time, the streets 122 are not peeled off the UV sheet 126.

Figure 7:
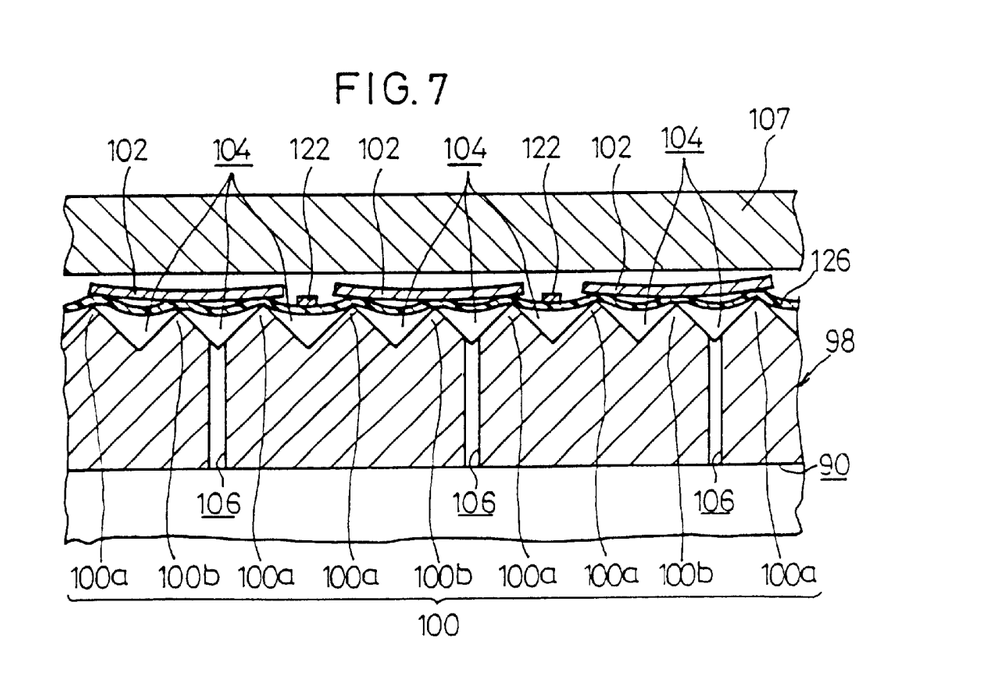
FIG. 7 is an enlarged vertical cross-sectional view showing the manner in which the chip peeling apparatus shown in FIG. 1 operates, with the sheet and chips being curved.
Figure 8:
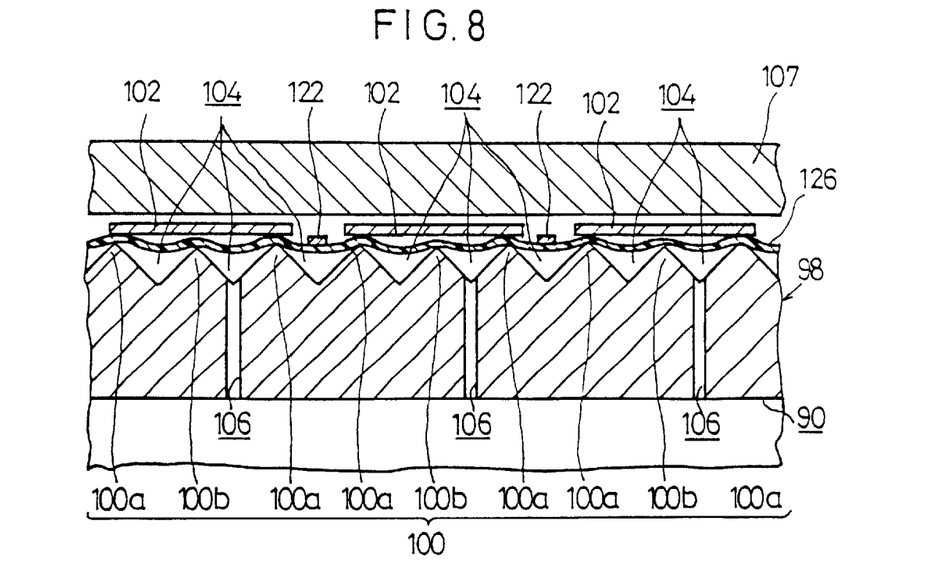
FIG. 8 is an enlarged vertical cross-sectional view showing the manner in which the chip peeling apparatus shown in FIG. 1 operates, with chips peeled off the sheet.

Upon continued attraction of the UV sheet 126, the central areas of the chips 102 are curved downwardly, as shown in FIG. 7. When the central areas of the chips 102 are curved to a given extent, the central areas of the chips 102 abut against and are supported by the tops of the second protrusions 110b, preventing the chips 102 from being curved further downwardly. Since the curved chips 102 are subjected to forces tending to recover them, the chips 102 gradually restore their original shape, allowing the UV sheet 126 to be gradually peeled off the chips 102. On the tops of the second protrusions 100b, the UV sheet 126 remains attached to the chips 102 until the chips 102 return to their original flat shape, when the UV sheet 126 is peeled off the chips 102 on the tops of the second protrusions 100b, as shown in FIG. 8.

Since the chips 102 are slightly curved as they are supported on the second protrusions 10b, the forces tending to recover the chips 102 are small. Consequently, the chips 102 do not jump off or are not positionally deviated when the UV sheet 126 is peeled off the chips 102. If the forces tending to recover the chips 102 are relatively large due to their shape or other factors, the chips 102 may possibly jump off. However, the holder plate 107 is effective in preventing the chips 102 from unduly jumping off, and hence preventing them from being positionally deviated. Inasmuch as the holder plate 107 is made of an electrically conductive material, the chips 102 are not attracted to the holder plate 107 because of electrostatic charges which are developed when the UV sheet 126 is peeled off the chips 102.

Because the UV sheet 126 is prevented from being unduly stretched by the abutment against the second protrusions 100b, the UV sheet 126 is protected against damage. Since the UV sheet 126 is not damaged, the vacuum created in the grooves 104 is securely maintained, avoiding the possibility of an undesirable peel-off failure of the chips 102. If adjacent chips 102 are peeled off the UV sheet 126 at different times, then the UV sheet 126 is subject to a horizontal force tending to move the UV sheet 126 horizontally. However, since the UV sheet 126 is held against the tops of the first and second protrusions 100a, 100b, the UV sheet 126 is prevented from being moved horizontally even under such a horizontal force, thus preventing the chips 102 from being positionally deviated.

Figure 9:
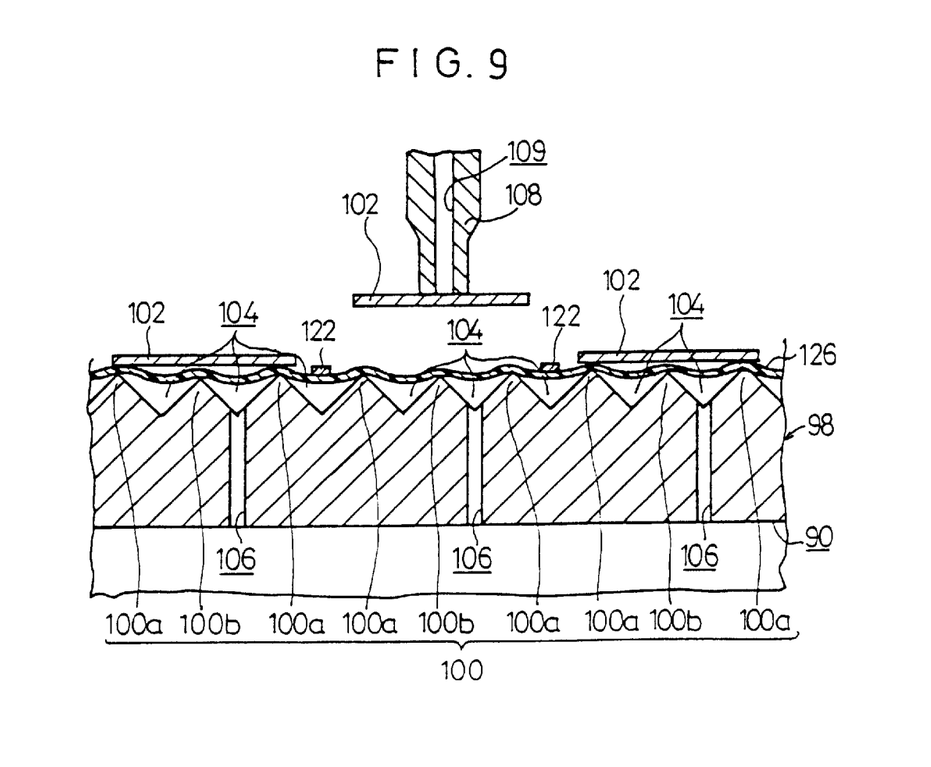
FIG. 9 is an enlarged vertical cross-sectional view showing the manner in which the chip peeling apparatus shown in FIG. 1 operates, with a chip peeled off the sheet and then attracted by a suction head.

Then, the holder plate 107 is displaced away from the chips 102, and the suction head 108 is lowered into abutment against one of the chips 102. The vacuum source connected to the suction head 108 is actuated to attract the chip 102 to the suction head 108. The suction head 108 is then elevated. Since the UV sheet 126 is attached to the chip 102 through a small area on the tops of the corresponding first protrusions 100a, the chip 102 is peeled off the UV sheet 126 with a small force, and held by the suction head 108, as shown in FIG. 9. The suction head 108 then carries the chip 102 to a next process.

The chips 102 will successively be peeled off the UV sheet 126 in the manner described above. Since the streets 122 are not peeled off the UV sheet 126, the streets 122 will not be delivered to the next process.

The tab 126 is held in intimate contact with the upper surface of the flat surface 97 through the UV sheet 126, as described above. Therefore, the tab 126 will not be peeled off the UV sheet 126.

A peeling test was conducted on the chips 102 using the chip peeling method and the chip peeling apparatus 60 described above. Details and results of the peeling test will be described below with respect to experimental and comparative examples.

EXPERIMENTAL EXAMPLE

In the chip peeling apparatus 60, the tops of adjacent ones of the protrusions 100 of a peeling base 98a were spaced 2.63 mm in an X-axis direction and 3.12 mm in a Y-axis direction. Four first protrusions 100a and five second protrusions 100b were closely positioned in a square pattern as shown in FIG. 3. Specifically, the first protrusions 100a were positioned in alignment with the four corners 103a~103d of a chip 102, and the second protrusions 100b were positioned in other regions.

A wafer 118 was placed on the chip peeling apparatus 60, and the vacuum pump 72 was actuated to peel the UV sheet 126. The time required for peeling the UV sheet 126, the positional deviation which the chip 102 suffered when the UV sheet 126 was peeled, the frequency with which the chip 102 was skewed when the UV sheet 126 was peeled, the frequency with which the chip 102 jumped when the UV sheet 126 was peeled, and the frequency of peeling failures between the UV sheet 126 and the chip 102 were measured.

COMPARATIVE EXAMPLE

Peeling bases 98b~98d with protrusions 100 of equal height were produced. On the peeling base 98b, the tops of adjacent ones of the protrusions 100 were spaced 3 mm in the X-axis direction and 3 mm in the Y-axis direction. On the peeling base 98c, the tops of adjacent ones of the protrusions 100 were spaced 2.5 mm in the X-axis direction and 2.5 mm in the Y-axis direction. On the peeling base 98d, the tops of adjacent ones of the protrusions 100 were spaced 1.94 mm in the X-axis direction and 2.34 mm in the Y-axis direction. The number of protrusions 100 for supporting one chip 102 was 9 on the peeling base 98b, 16 on the peeling base 98c, and 16 on the peeling base 98d. The time required for peeling the UV sheet 126, the positional deviation which the chip 102 suffered when the UV sheet 126 was peeled, the frequency with which the chip 102 was skewed when the UV sheet 126 was peeled, the frequency with which the chip 102 jumped when the UV sheet 126 was peeled, and the frequency of peeling failures between the UV sheet 126 and the chip 102 were also measured with respect to these peeling bases 98b, 98c, 98d.

The results of the peeling test are shown in Table below.

TABLE

|  | Distance between protrusions | | Peeling | Positional | Frequency of | Frequency of | Frequency of peeling |
|---|---|---|---|---|---|---|---|
|  | X-axis [mm] | Y-axis [mm] | time [sec.] | deviation [mm] | skews [%] | jumps [%] | failures [%] |
| Inv. Ex. | | | | | | | |
| Peeling base 98a | 2.63 | 3.12 | 15 | 0 | 0 | 0 | 0 |
| Com. Ex. | | | | | | | |
| Peeling base 98b | 3.0 | 3.0 | 60 | 0.06 | 7.3 | 2.0 | 0 |
| Peeling base 98c | 2.5 | 2.5 | 100 | 0.10 | 12.2 | 2.0 | 0 |
| Peeling base 98d | 1.94 | 2.34 | 300 or longer | 0 | 1.5 | 0 | 13.3 |

It can be seen from the above test results that the chip peeling apparatus 60 according to the present invention had a short peeling time, suffered no positional deviation of the chip 102, and did not cause the chip 102 to be skewed, jump, and suffer a peeling failure.

With the peeling bases 98b, 98c according to the comparative example, however, the peeling time was long, the chip 102 suffered a positional deviation, was skewed, and jumped though no peeling failure occurred. With the peeling base 98d, the chip 102 suffered no positional deviation and did not jump, but the peeling time was quite long and the frequency of peeling failures was high.

The chip peeling method and the chip peeling apparatus according to the present invention offer the following advantages:

The chips are prevented from being damaged by needles which would otherwise be employed in the conventional chip peeling apparatus. When the chips are curved, they are supported by the second protrusions and hence prevented from being further curved. Therefore, the chips are prevented from being cracked or broken, and the sheet is protected against damage, preventing peeling failures which would otherwise take place due to the elimination of the vacuum needed to peel the chips off the sheet. Since forces tending to recover the chips are small, the chips do not suffer a possibility of positional deviations. Even if the chips are subject to large restoring forces, they are prevented from jumping off by the holder plate, and hence from being positionally deviated. Inasmuch as the time required to peel off the chips can be shortened, the chips can be peeled off the sheet with improved efficiency.

Although a certain preferred embodiment of the present invention has been shown and described in detail, it should be understood that various changes and modifications may be made therein without departing from the scope of the appended claims.

What is claimed is:

1. An apparatus for peeling a plurality of chips of a wafer off a sheet attached to a reverse side of the wafer, comprising:

a peeling base having integrally formed therein (1) a plurality of quadrangular pyramidally shaped first protrusions positioned on said peeling base so as to be aligned with predetermined locations on the chips and having respective tops for supporting the chips and (2) a plurality of quadrangular pyramidally shaped second protrusions positioned on said peeling base lower than said first protrusions and having respective tops for supporting the chips when said chips are curved; and a vacuum source in operating relationship with said peeling base and communicating with gaps in said peeling base between adjacent ones of said first protrusions or adjacent ones of said second protrusions, for attracting said sheet to peel each of the chips off the sheet.

2. An apparatus according to claim 1, wherein said first protrusions have a first height and said second protrusions have a second height which is smaller than said first height by a value equal to or smaller than the thickness of said sheet.

3. An apparatus according to claim 1, wherein said first protrusions have respective tops positioned in the vicinity of respective corners of the chips.

4. An apparatus according to claim 1, wherein said peeling base has holes defined therein in communication with said vacuum source, said first protrusions and said second protrusions being integrally formed on an upper surface of said peeling base.

5. An apparatus according to claim 4, further comprising a base having a chamber held in communication with said vacuum source, and a seat mounted on said base, said peeling base being supported on said seat.

6. An apparatus according to claim 5, further comprising a support base for holding an outer circumferential edge of the wafer, said seat supporting said support base and said peeling base.

7. An apparatus according to claim 4, further comprising a holder plate for pressing said wafer, said holder plate being movable toward and away from the wafer placed on the upper surface of said peeling base.

8. An apparatus according to claim 1, further comprising a support base surrounding said first protrusions and said second protrusions, for abutting against an outer circumferential edge of said wafer, said support base having a flat surface for maintaining intimate contact with the outer circumferential edge of said wafer.

9. An apparatus according to claim 1, wherein said first protrusions include first projections positioned adjacent to each other for supporting chips which are positioned adjacent to each other with a cut fragment left therebetween.

10. An apparatus according to claim 1, further comprising a holder plate of an electrically conductive material which is disposed closely to said first protrusions and said second protrusions, for preventing the chips from jumping off when the chips are peeled off said sheet.

11. An apparatus according to claim 10, wherein said holder plate is positioned with respect to the chips on said support base at a position spaced from the chips by a distance equal to or smaller than the thickness of the chips.

\* \* \* \* \*